(12) United States Patent
Drejer

(10) Patent No.: US 9,543,908 B2
(45) Date of Patent: Jan. 10, 2017

(54) ADAPTIVE RAIL VOLTAGE REGULATION ON POWER SUPPLIES

(71) Applicant: BANG & OLUFSEN A/S, Struer (DK)

(72) Inventor: Jens Hjort Drejer, Struer (DK)

(73) Assignee: BANG & OLUFSEN A/S, Struer (DK)

( * ) Notice: Subject to any disclaimer, the term of this patent is extended or adjusted under 35 U.S.C. 154(b) by 0 days.

(21) Appl. No.: 14/627,085

(22) Filed: Feb. 20, 2015

(65) Prior Publication Data

US 2015/0244333 A1 Aug. 27, 2015

(30) Foreign Application Priority Data

Feb. 21, 2014 (DK) ................................ 2014 00092

(51) Int. Cl.
*H04B 1/00* (2006.01)
*H03F 3/187* (2006.01)
*H03F 1/02* (2006.01)

(52) U.S. Cl.
CPC ............ *H03F 3/187* (2013.01); *H03F 1/0222* (2013.01); *H03F 2200/03* (2013.01)

(58) Field of Classification Search
CPC .. H03K 19/17784; G05F 1/56; H03F 2200/03; H03F 3/68
USPC .......................................... 381/120; 327/109
See application file for complete search history.

(56) References Cited

U.S. PATENT DOCUMENTS

| 5,396,194 A | 3/1995 | Williamson et al. |
| 8,008,953 B1 * | 8/2011 | Brumett, Jr. ......... H03K 17/166 327/109 |
| 2003/0080816 A1 | 5/2003 | Quarfoot et al. |
| 2009/0220110 A1 | 9/2009 | Bazarjani et al. |
| 2010/0164630 A1 * | 7/2010 | Witmer ................. H03F 1/0244 330/297 |
| 2010/0259235 A1 * | 10/2010 | Ozalevli ................... G05F 1/56 323/274 |

FOREIGN PATENT DOCUMENTS

| EP | 1317105 A1 | 6/2003 |
| EP | 2432120 A1 | 3/2012 |
| WO | WO 2009/019459 A1 | 2/2009 |

OTHER PUBLICATIONS

Search Report prepared by the Danish Patent and Trademark Office on Oct. 6, 2014, for Danish Application No. PA 2014 00092.

* cited by examiner

*Primary Examiner* — Akelaw Teshale
(74) *Attorney, Agent, or Firm* — Sheridan Ross PC

(57) ABSTRACT

The system comprises a Digital Signal Processing module, a Power Supply Unit and an audio amplifier. In the Digital Signal Processing module, the level of the digital audio signal is detected for adjusting the rail voltage in the amplifier. The digital audio signal is delayed by the Digital Signal Processing module prior to transforming and feeding it into the audio amplifier for amplification in order to stabilize the rail voltage after adjustment of the rail voltage to an increased level. Further in order to decrease the power consumption, especially in battery driven amplifiers, an adjustment of the rail voltage to a reduced level is delayed by a second predetermined time length (S_Hold) of 1 to 5 seconds as this reduces the number of adjustments of the rail voltage.

10 Claims, 5 Drawing Sheets

ADAPTIVE RAIL VOLTAGE REGULATION ON POWER SUPPLIES

CROSS-REFERENCE TO RELATED APPLICATIONS

Figure 1:
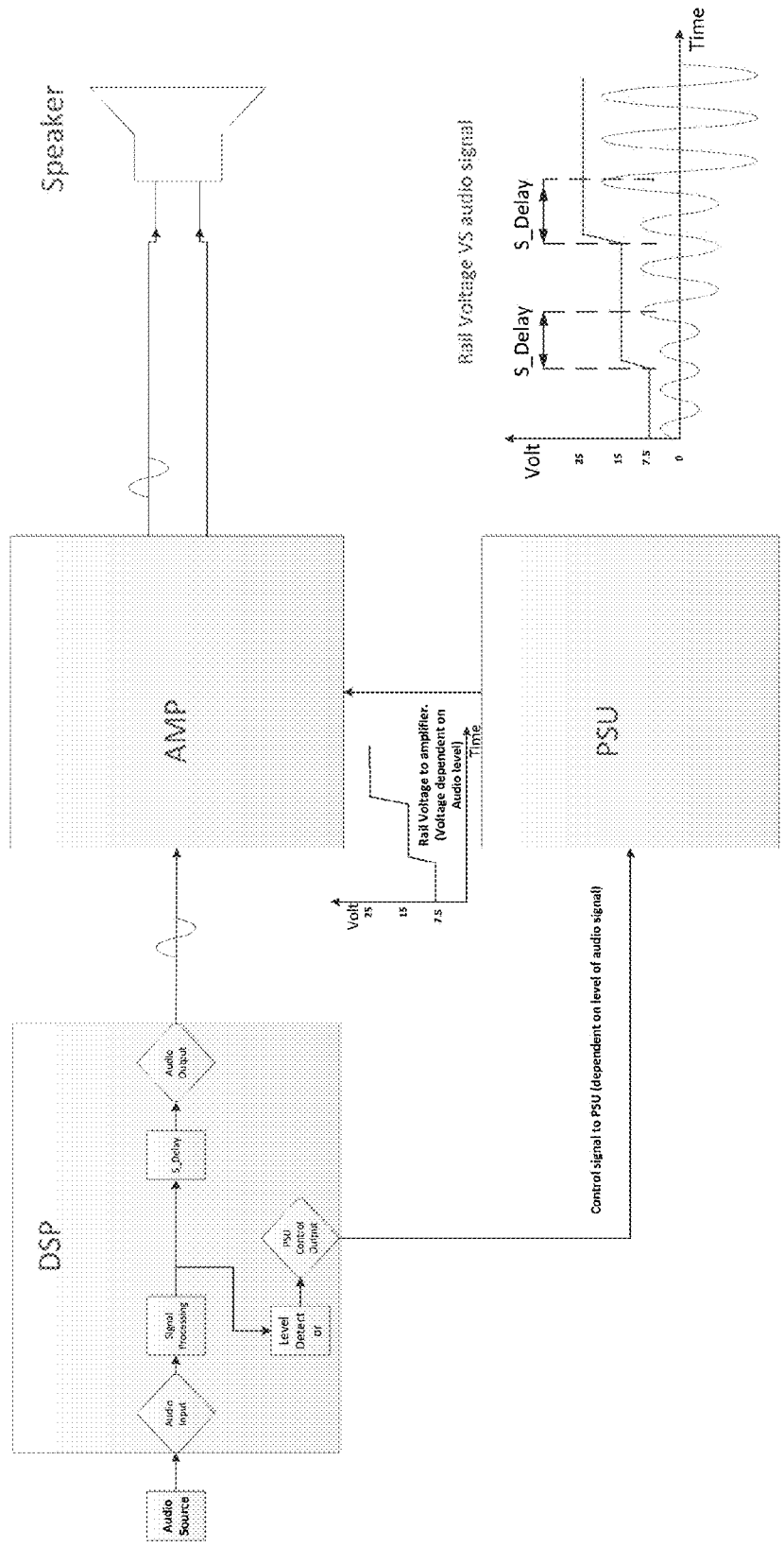

This application claims the benefit of Danish Patent Application No. PA 2014 00092 filed Feb. 21, 2014, the contents of which are incorporated herein by reference.

FIELD OF THE INVENTION

The present invention relates to a method and a system for amplification of audio signals, wherein a power supply is adapted to deliver a required voltage to the audio amplifier and minimize the idle loss.

BACKGROUND OF THE INVENTION

More and more electronic equipment is portable and requires wireless power supplies for the comfort of the user. Thus, batteries or rechargeable accumulators, in the following called batteries for simplicity, are applied to power the equipment. To fulfill the demand for high output, i.e. high audio volume when active, the product should be energy efficient at the same time.

The idle loss in an audio amplifier is related to the amplifiers rail-voltage (supply voltage). To minimize this idle loss, it is generally known for amplifier systems to regulate the output rail-voltage from the amplifiers power supply. An adaptive rail-voltage regulation is enabled for analyzing the rail-voltage requirement based on the level of the audio signal, typically the amplitude level; thus, it is possible to adjust the rail-voltage high enough to avoid voltage clipping but not considerably higher than necessary, so that idle loss is minimized.

US patent application No. 2010/0164630 by Witmer et al. discloses a method reducing the average power consumption for an amplifier. A digital audio input signal is split into two parts, of which one is delayed before being fed into an amplifier for output to the loudspeaker, and the other signal is processed for determining signal amplitude information, which is used to adjust the maximum available supply current for the amplifier of least sufficient magnitude to avoid distortion of the delayed signal.

US patent application No 2009/0220110 by Bazarjani et al. discloses a system and method for power consumption for audio playback, where a signal envelop is evaluated for regulating the power for the amplifier.

European patent application No. EP1317105 by Melsa, assigned to Texas Instruments Inc. discloses a line driver using a class G amplifier and programmable peak detector. The peak detector analyzes the digital input signal which is used for adjustment of the rail voltage of the amplifier. Other amplifier systems are disclosed in European patent application EP2432120, U.S. Pat. No. 5,396,194 by Williamsen, US patent application No. 2003/0080816, and International patent application WO2009/019459.

DESCRIPTION/SUMMARY OF THE INVENTION

It is an object of the invention to provide a general improvement in the art. It is also an objective to provide an amplifier system and a method for driving it and where the rail voltage is regulated in dependence of the input signal. A further objective is a minimization of the power consumption, especially with respect to batteries as power sources.

It has been observed that the prior art systems typically need a relatively quick and strong power supply in order to ramp up the rail voltage quickly in dependence of the changes of the input signal. Thus, although, the average power may be kept low in such systems, the needed instant peak power can be relatively high. As thorough study has revealed, this poses problems when using relatively small batteries for the amplifier because such high peak currents are not easily available and also limit the time until the next change or recharge of the batteries. Especially relatively small portable amplifier systems are popular, as these are carried with users on their travel, for instance. However, the user in such case does not always have a power source available for recharging the battery of the amplifier system, why a long battery lifetime is necessary while still having a battery with small dimensions. For this reason, there is a strong demand for further improvement for reduction of power consumption in relation to battery-driven audio amplification systems.

Various features of an improved amplification system and a method for operating such system are described in more detail in the following.

A first aspect of the invention is an adaptive rail-voltage regulation method enabled for analyzing the rail-voltage requirement based on the audio input signal. The regulation method comprises continuously detecting the level of the incoming audio signal, delaying incoming audio signal to await the power supply to stabilize, and adjusting the rail voltage so that the audio signal is amplified without voltage clipping. A further aspect is a delay of the ramping down after ramping up of the rail voltage.

The system comprises a Digital Signal Processing module, a Power Supply Unit and an audio amplifier. The method for regulating an adaptive rail-voltage in the audio amplifier comprises receiving a digital audio signal by a Digital Signal Processing module, converting the digital audio signal to an analog audio signal and feeding the analog audio signal to the audio amplifier. Various details are described in the following.

In the Digital Signal Processing module, the level of the digital audio signal is detected, on which basis the digital audio signal level is analyzed with respect to the rail-voltage requirement for the audio amplifier and with the purpose of amplifying the analog audio signal without voltage clipping. In accordance with the rail voltage requirements, a control signal is sent from the Digital Signal Processing module to the Power Supply Unit, the control signal causing adjustment of the rail voltage in the audio amplifier by the Power Supply Unit. The digital audio signal is delayed by the Digital Signal Processing module prior to transforming and feeding it into the audio amplifier for amplification. The delay is of a first predetermined time length (S_delay) sufficiently long for the Power Supply Unit to stabilize the rail voltage after adjustment of the rail voltage to an increased level.

As a further optional feature, adjustment of the of the rail voltage to a reduced level as a consequence of the detection of a reduced level of the digital audio signal is delayed for a second predetermined time length (S_Hold), which is advantageously in the order of 1 to 5 seconds, for example 1 second, 2 seconds, 3 seconds, 4 seconds or 5 seconds. This relatively long delay reduces the overall number of adjustments of the rail voltage, as a repeated audio signal, such a further drum beat in a piece of music, is contained within the time length of the delay. As long as repeated drum beats continue in the audio signal, the rail voltage level is not reduced, and the each beat is followed by a new delay period of 1-5 seconds, until there occurs a period of length S_Hold without the requirements for keeping the rail voltage at the level or the requirements for further increasing it. Only, if the rail voltage requirements are lower than the current rail voltage requirements during the entire predetermined time length S_Hold, the rail voltage is lowered. This is advantageous, especially, when powering the amplifier by batteries, because especially the ramping up of the rail voltage is draining the battery.

Advantageously, the Digital Processing Unit comprises a Signal Processing block in which the level of the acoustic bass in the digital audio signal is reduced relatively to the high frequency part of the digital audio signal of the digital audio signal for thereby reducing power consumption of the amplifier. For example, the Signal Processing block comprises a limiter in terms of an acoustic bass linearization.

In further embodiments, the method comprises splitting the digital audio signal into a first part and a second part. The first part is used for detecting the level and analyzing the rail-voltage. The second part is delayed and converted before being fed it into the amplifier.

Advantageously, the splitting is made on the digital audio signal between the Signal Processing block and the delay, thus, after the signal processing. This is in contrast to the aforementioned US patent application No. 2010/0164630 by Witmer et al. where the splitting is done before the signal processing. The advantage of the splitting after the signal processing is that the signal processing can be used to reduce the acoustic bass before the rail voltage is determined by the level detector.

In some embodiments, the Power Supply Unit comprises a battery or battery pack as the only power supply, especially rechargeable battery or batteries. For example, the battery is provided with a basic voltage and the Power Supply Unit comprises a boost converter. The method then comprises boosting the voltage by the boost converter and thereby increasing the rail voltage above the basic voltage of the battery.

In some embodiments, the Power Supply Unit comprises a switch for turning off boost converter for selectively only using the basic voltage of the battery for the rail voltage. Optionally, such switch is a manual switch for giving the user the possibility of extending the time until the battery needs charging again. Alternatively or in addition, the boost converter is turned off automatically when the battery power is less than a predetermined level. For this a battery power detector and controller is employed.

In further embodiments, the adjustment of the rail voltage to an increased or reduced level is performed in steps. For example, it is done in steps that are consecutive in a digital look up table. Optionally, for an 8V battery and a 25V peak voltage, there are predetermined a number of identical increments and each incremental step is used for increasing the rail voltage step wise, which each step corresponding to one increment, until the required rail voltage is achieved. Alternatively, the rail voltage is regulated as a single jump from one level to another level in the digital look up table, where the jump is covering multiple increments. In other words, the steps have a height that is determined as a sum of a number of identical predetermined level increments or that is determined by the difference between two levels given as entries in a digital look up table.

SHORT DESCRIPTION OF THE DRAWINGS

Figure 2:
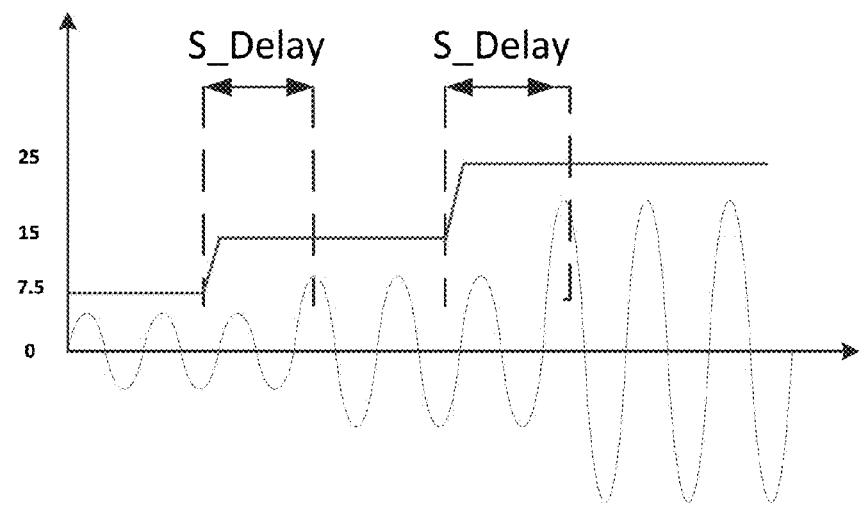
Figure 3:
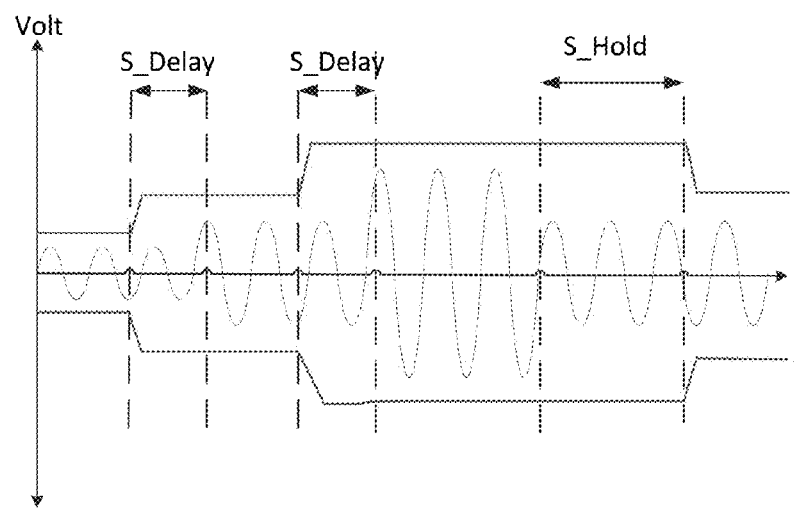
Figure 4:
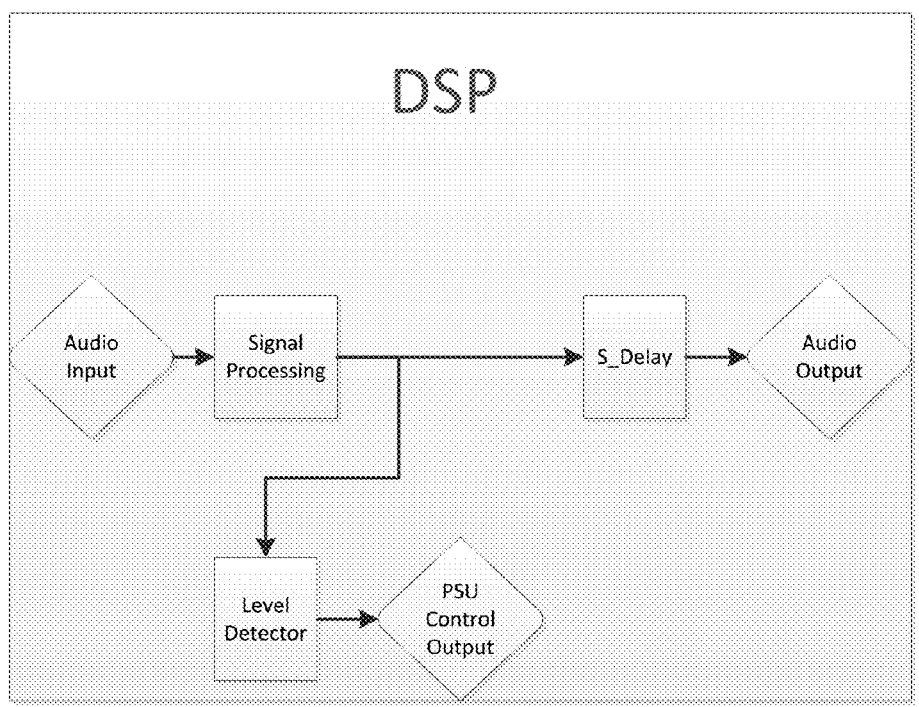
Figure 5:
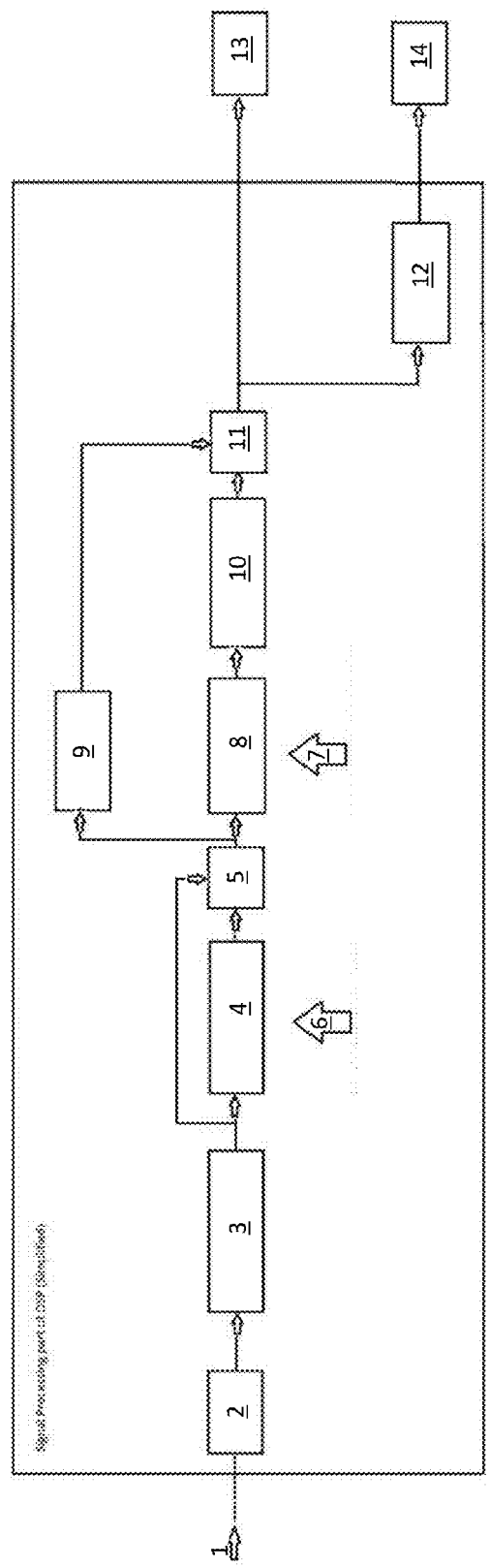
Figure 6:
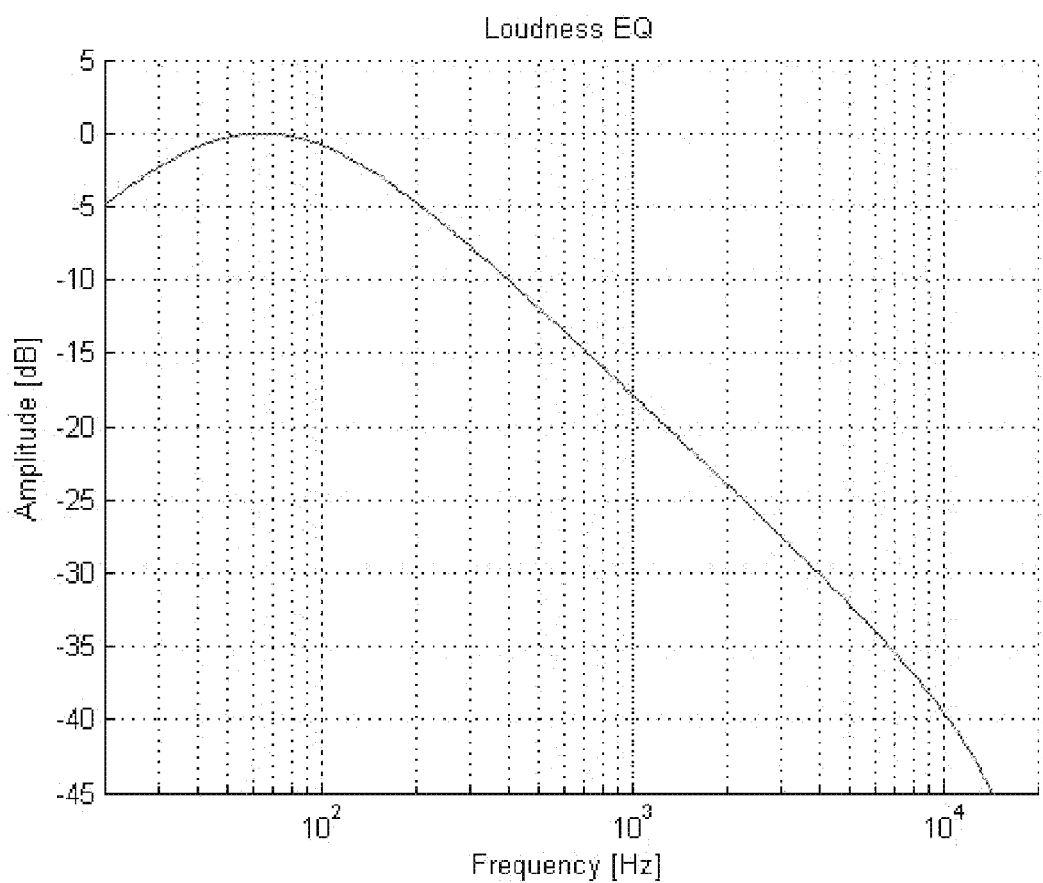

The invention will be explained in more detail with reference to the drawing, where FIG. 1 is a system overview;
FIG. 2 illustrates the rail voltage for the audio signal;
FIG. 3 illustrates the delay before decreasing the rail voltage;
FIG. 4 displays the concept of the DSP in enlarged vision;
FIG. 5 illustrates an example of a signal processing part of DSP;
FIG. 6 shows a possible EQ curve.

DETAILED DESCRIPTION/PREFERRED EMBODIMENT

As illustrated on FIG. 1 with a system overview, a Digital Signal Processing module [DSP] controls the Rail voltage output from a Power Supply Unit [PSU] to an Audio Power Amplifier [AMP] where the Rail voltage varies as a function of the audio signal [Rail Voltage VS audio signal]. For illustration purpose this is shown for single supply implementation only. The audio signal is then fed to a [Speaker].

The DSP detects the level of the incoming audio signal, and controls the PSU. The output rail voltage to the AMP is adjusted so that the Audio signal is amplified without voltage clipping but with relative low headroom from the audio signal to the rail voltage in order to minimize idle loss.

The DSP module also delays the Audio signal to the AMP by a time length of S_Delay so that the PSU has a stabilized output rail-voltage at the required voltage, This is illustrated by the Rail voltage VS audio signal graph.

Thus, an aspect of the invention is an adaptive rail-voltage regulation method, where the level of the incoming audio signal detection is measured and validated versus two or more predefined level steps, where each level step is a level increment on a predefined level scale; for example, each level step is predefined as a step of 3 dB, and the Input audio signal intensity is validated as the number of such 3 dB steps necessary to resemble the level of the input audio signal. Alternatively, the step is of different magnitude than 3 dB, for example 2 dB or 4 dB.

The input signal delay of time length S_Delay is applied on each of the two or more audio signal input level as detected, such that a larger number of level steps leads to a larger delay S_Delay as the input signal delay S_Delay is to be applied until the power supply stabilizes into a required operation voltage.

The rail voltage is correspondingly adjusted to a value according to predefined steps. In other words, if the audio input level is measured to correspond to a certain number of steps of the predefined step-wise scale, the rail voltage is raised to a level corresponding to this certain number of steps.

FIG. 2 displays the rail voltage in relation to the schematically illustrated audio signal. The figure shows the relationship between the input audio signal and the rail voltage; when the audio signal is low, as illustrated in the most left part of FIG. 2, the rail voltage is minimized, and when the audio signal increases, the rail voltage starts to increase a time interval of S_Delay before the audio signal actually increases. This delay is possibly due to the delay unit in the DSP which delays the incoming signal for amplification until the amplifier is actually ready for performing the amplification at the higher rail voltage with minimized distortion.

FIG. 3 shows a rail voltage implementation for a "+/−" dual supply.

This delay of the time S_Delay is giving the power supply PSU time enough to achieve the full necessary rail voltage before the audio signal actually demands a high rail voltage for proper amplification. This decreases the risk for extensive distortion of the audio signal with increased amplitude during the ramping-up of the voltage. Typical delay times for S_Delay are 15-30 msec, for example 15-25 msec or 15-20 msec.

As illustrated, the rail voltage increases and subsequent decreases again. However, the decrease is delayed a time span of S_Hold. It has been found advantageous that the decrease delay S_Hold is relatively long. For example, the S_Hold time is in the range from 1 to 5 seconds so that the rail voltages does not have to change if there is a peak in the audio signal that requires high rail voltage within that time span. In other words, after an increase of the rail voltage, the level is kept for a time span of S_Hold, for example 1-5 seconds, in order to avoid to frequent ramping down and up of the rail voltage. In this connection, it is pointed out that quick ramping-up of the rail voltage in battery-driven amplifiers causes high consumption of battery power and reduces the time until the next recharge or exchange of the battery. The extended time span S_Hold in the order of seconds, thus, reduces the overall power consumption from the battery due to the reduced number of necessary ramping-up, which is especially important with respect to peak currents or currents near the peak level.

In prior art amplifying devices that are not driven by batteries, such long delay feature of 1-5 seconds before ramping down the rail voltage does not appear necessary, as the typical power sources can readily provide enough power for quick ramping up the rail voltage again after ramping it down. In such prior art cases, a quick ramping-down is appropriate in order to minimize the overall power consumption. However, such repeated ramping up is difficult when the battery is relatively small because the current cannot be delivered quickly enough and also drains the battery excessively. For this reason, in a further embodiment, the rail voltage is hold at the same level in a period of time as given by the S_hold value of 1-5 second. This makes it possible to play repeated beats in a loudspeaker without the necessity of as many repeated ramping up. Also, the ramping up from an intermediate rail voltage level to a higher rail voltage level is made easier and quicker.

FIG. 4 displays the concept of the DSP. The modules consist of a digital audio input and an audio output path, which typically is an analog output, unless the amplifier is a digital amplifier. Included is a signal processing block that also comprises an equalizer function EQ of the audio signal and, potentially, other signal processing means, e.g. audio limiters, filters and alike. FIG. 6 illustrates an example of an equalizer function EQ. After the signal processing unit, there is provided a level detector block, which detects the rail voltage requirement for the attached audio power amplifier to amplify the audio signal without voltage clipping.

The level detector is followed by a PSU Control Output block which communicates with the power supply; e.g. via one General Purpose Input/Output (GPIO) pin using a Pulse-Width Modulation (PWM) signal to control the PSU as shown in the table below:

| PWM Duty cycle | Rail Voltage |
| --- | --- |
| 100% | 8 Volt ( if an battery supply is used, it would probably run direct on the battery voltage |
| 90% | 10 Volt |
| 70% | 14 Volt |

-continued

| PWM Duty cycle | Rail Voltage |
| --- | --- |
| 45% | 18 Volt |
| 10% | 22 Volt |
| 0% | 25 Volt |

For example, if an 8V battery is used, this is the ground level for the rail voltage, and the voltage is boosted by the converter to a higher voltage level. This is also illustrated in FIG. 1. In FIG. 1, it is also exemplified that the rail voltage is ramped up to 14V, which is a single increment of two steps according to the scale in the table above, namely from 8V to 14V, not using 10V as an intermediate level. As further illustrated in FIG. 1, a subsequent increase of the rail voltage is from 14V to about 25V, which is the peak value for the boost system and only held for a very short while. As per the table above, the number of voltage steps are 5 from 8V to 25V, however, the number of predefined increments is usually more, for example up to 50 increments or even more.

With respect to the delay S_Hold, the following is pointed out. In case that an intermediate voltage boost of 14V is applied during the S_Hold period, the step for further boosting the rail voltage up to a maximum rail voltage of 25V is not as high as the step if the maximum rail voltage of 25V has to be reached from the basic level of 8V. Seeing that the ramping up is a challenge for battery-driven amplifiers, the delay of S_Hold is a pronounced advantage in these cases.

The battery for the PSU can also be used to provide power to the DSP. Alternatively, the DSP comprises a second battery. The batteries are typically rechargeable, for example lithium-ion batteries.

As exemplified above, preset data in tables support the signal detection and adjustment processing. As an example, the data include detecting the input audio signal level, e.g. 3 dB per step, and adjusting the output voltage in predefined steps, e.g. 1-50.

The AMP may be a standard amplifier designed to operate over a wide rail voltage range. Depending on the quality of the loudspeaker transducer, it might be an advantage not to amplify the high frequencies to the same level as the low frequencies, as the low frequencies may case distortion of the sound if the rail voltage cannot be raised sufficiently high or not sufficiently fast. The latter is an issue when using batteries as power source in relatively small amplifier units, especially portable units, where the battery size and power is adjusted only to moderate power consumption. In this case, it is an advantage to limit the audio amplification level of the low frequencies more than the level for the high frequencies. For this function, an equalizer is potentially used in the system. An example is a system with a limiter in terms of an acoustic bass linearization which reduces the amplitude of the low frequencies at high audio amplification levels.

For example, the shift from low to high amplification levels, at which the acoustic bass is relatively decreased, is provided in relation to a threshold level. With reference to the table above, especially if a battery is used, the bass reduction can be set to zero at the lowest rail voltage level, and be increased relatively to each increased voltage level, such that the bass reduction is largest at peak voltages.

As illustrated in FIG. 4, the incoming audio signal is processed in the signal processing unit before it is split between one part that is going to the amplifier through a delay unit and a second part which is used to control the PSU. This is in contrast to many prior art systems and has an advantage. The advantage is that the signal processing unit can modify the audio signal by filters and limiters, for example by the equalizing function where low frequencies are amplified less than high frequencies, before the level detection is performed and the PSU control is involved.

In comparison, in a system as illustrated in US patent application No. 2010/0164630 by Witmer, especially its FIG. 1A, the signal is split prior to the signal processing, which implies that the audio signal that is reaching the amplifier is not modified by a frequency-dependent equalizer function in the signal processing system. Thus, in US2010/0164630, suppression of the amplification of the low frequencies of the audio signal relatively to the high frequencies cannot be performed by the signal processing unit, because that part of the signal that is going to the amplifier is not processed by the signal processing system.

FIG. 5 is a flow chart of a possible signal processing part of the DSP. As illustrated, a digital audio input signal enters the system and traverses a highpass filter, for example cutting off at 20-30 kHz. As a following step, a sound equalizer EQ module 3 is used for bass boost, for example according to an EQ curve as in FIG. 6 where the bass is increased for frequencies below about 200 Hz.

Further optional functions include speaker driver compensating and resonance filters. The signal is split into two parts of which one part is going directly to a signal adder 5 and the other part reaches the signal adder 5 after having processed in a module 4 for automatic loudness with bass boost where, however, the output is limited at fixed amplitude. This step 4 is a first point for limiting the Bass amplitude at a relatively low level, for example −20 db or −25 db of the maximum signal processing level (SPL).

For example, when using batteries as exemplified in the table above, the contribution of the loudness circuit at low volume levels is limited to a low rail voltage. For example, the limit is set to −25 db of the max signal processing level (SPL). For example, for an 8V battery, the voltage can be set between 8V and the boosted voltage of 12-14V. If the volume level is increased, the loudness circuit does not contribute as much to the overall signal as in the case where the loudness effect is not limited, and the rail voltage need not be as high. In connection with the user experience of the sound, it is pointed out that the ear of the human is more sensitive for low frequencies at high volume level.

After having combined the split signal in the signal adder 5, it is split once more into one part traversing a highpass filter 9 for filtering out loudness and bass boost and a second part entering a bass limiter 8. The bass limiter is used to limit the maximum excursion of the woofer. The signal is also limited in accordance with to the maximum peak current capacity from the batteries. This is the second point 7 for limiting the bass amplitude. For example, the sound level for bass frequencies at 30-50 Hz is limited relatively early when increasing the sound level for small loudspeakers, especially for portable devices, and may be adjusted to only reach the 16V level for the bass (sound of drums, for example) instead of the maximum voltage of 25V for the case if the bass were not limited. Optionally, the bass limiter 8 is also limiting the available peak current from the battery, for example 4-6 amps. The sound from the smaller loudspeakers would as a result sound a bit weak in the bass when playing loud, however, the sounds is played without distortion. A slight distortion of the bass is acceptable, however, and passed through the low pass filter 10 in order to make the bass sound slightly stronger, although it also has the function of filtering out artifacts from the bass limiter 8.

A second signal adder 11 is used for the combination of the signal parts from the highpass filter and the low pass filter. A third split is made after the second signal adder 11 of which one enters the level detector 12 and a second part enters a delay module 13 before the signal enters the amplifier, as it is illustrated in FIG. 4 and FIG. 1. The level detector 12 is used for determining the level of the signal and sends a corresponding control signal to the PSU 14 for adjustment of the rail voltage in the amplifier, where the PSU control output includes the delay S_Hold.

The PSU has a control interface to regulate the output voltage over a wide area, and specifically for audio application, a power supply is chosen with high peak power abilities, where the long term power abilities (>1 sec) is less critical, since music often requires much peak power but the average power consumption is considerable lower than the peak requirements.

There are several advantages of using the adaptive Rail voltage regulation on power supplies:
1) Considerable lower power consumption when used in idle/low-level situations (which is by far the most common situation for the average user of consumer electronics).
2) Lower temperature in the product due to lower power consumption/idle loss.
3) If used in battery operated systems (e.g. portable radio, loudspeaker) it can considerable expand the battery playtime with a factor of 2-3 when playing at low levels and hence prolong the battery's lifetime, this due to reduced charging/discharging cycles.
4) Ultimately it will reduce $CO_2$ emission/pollution due to reduced power consumption.

The invention is applicable in many types of apparatus related to consumer electronics, especially in wireless connected and battery/accumulator driven equipment.

With reference to the table above concerning the PWM Duty Cycle and with reference to the discussion above with respect to battery-driven audio amplifiers, it is pointed out that the amplifier system in some embodiments is configured for manually turning off the PSU such that only the battery basic power is used for running the amplifier instead of using power for a boost converter that is ramping-up the rail voltage. The consequence is that the sound is at a relatively lower level. However, this is advantageous in case that the user prioritizes an extended time until the battery needs recharging over the possibility of a louder sound level. Alternatively or in addition, the boost converter is turned off automatically when the battery power is less than a predetermined level. For this a battery power detector and controller is employed.

In the following, some aspects of the method are described.

Aspect 1: An adaptive rail-voltage regulation method enabled to analyzing the rail-voltage requirement based on the audio signal, the regulation method characterized by continuously to
  Detects the level of the incoming audio signal;
  Delay incoming audio signal to await the power supply to stabilize;
  Adjust the rail voltage so audio signal is amplified without voltage clipping.

Aspect 2: An adaptive rail-voltage regulation method according to aspect 1, where the level of incoming audio signal detection is measured and validated versus two or more predefined steps.

Aspect 3: An adaptive rail-voltage regulation method according to aspect 2, where the rail voltage starts to increase S_Delay before the audio signal increases.

Aspect 4: An adaptive rail-voltage regulation method according to aspect 3, where the input signal delay S_Delay is applied until the power supply stabilizes into a required operation voltage.

Aspect 5: An adaptive rail-voltage regulation method according to aspect 4, where the rail voltage is adjusted to a value according to a predefined step.

Aspect 6: An adaptive rail-voltage regulation method according to aspect 5, where the rail voltage is hold at the same level in a period of time as given by the S_hold value.

Aspect 7: An apparatus including a power supply enabled with means according to all aspects above.

The invention claimed is:

1. A method for regulating an adaptive rail-voltage in an audio amplifier, the method comprising,
   receiving a digital audio signal by a Digital Signal Processing module, converting the digital audio signal to an analog audio signal and feeding the analog audio signal into the audio amplifier;
   in the Digital Signal Processing module detecting the level of the digital audio signal and based on the digital audio signal level analyzing the rail-voltage requirement for the audio amplifier to amplify the analog audio signal without voltage clipping;
   in accordance with the rail voltage requirements sending a control signal from the Digital Signal Processing module to a Power Supply Unit, the control signal causing adjustment of the rail voltage in the audio amplifier by the Power Supply Unit;
   delaying the digital audio signal by the Digital Signal Processing module prior to transforming and feeding it into the audio amplifier for amplification, wherein the delay is of a first predetermined time length (S_delay) sufficiently long for the Power Supply Unit to stabilize the rail voltage after adjustment of the rail voltage to an increased level;
   delaying an adjustment of the of the rail voltage to a reduced level, as a consequence of the detection of a reduced level of the digital audio signal, by a second predetermined time length (S_Hold) of 1 to 5 seconds in order to reduce the number of adjustments of the rail voltage.

2. A method according to claim 1, wherein the Digital Processing module comprises a Signal Processing block in which the level of the acoustic bass in the digital audio signal is reduced relatively to the high frequency part of the digital audio signal of the digital audio signal for thereby reducing power consumption of the amplifier.

3. A method according to claim 2, wherein the Signal Processing block comprises a limiter in terms of an acoustic bass linearization.

4. A method according to claim 1, wherein the method comprises splitting the digital audio signal into a first part and a second part, wherein this first part is used for detecting the level of the digital audio signal and analyzing the rail-voltage, and wherein the second part is delayed and converted before being fed it into the amplifier.

5. A method according to claim 2, wherein the method comprises splitting the digital audio signal into a first part and using this first part for detecting the level and analyzing the rail-voltage and a second part that is delayed and converted before being fed into the amplifier; and wherein the splitting is made on the digital audio signal between the Signal Processing block and the delay.

6. A method according to claim 1, wherein the adjustment of the rail voltage to an increased or reduced level is performed in a step with a height that is determined as a sum of a number of equal predetermined level increments or that is determined by the difference between two levels given as entries in a digital look up table.

7. A method according to claim 6, wherein the Power Supply Unit comprises a battery or battery pack as the only power source.

8. A method according to claim 7, wherein the battery or battery pack is provided with a basic voltage and wherein the Power Supply Unit comprises a boost converter and the method comprises boosting the voltage by the boost converter and thereby increasing the rail voltage above the basic voltage of the battery.

9. A method according to claim 8, wherein the Power Supply Unit comprises a manual switch for turning off boost converter for selectively only using the basic voltage of the battery for the rail voltage.

10. A method according to claim 8, wherein the Power Supply Unit comprises a switch for turning off boost converter for selectively only using the basic voltage of the battery for the rail voltage and wherein the method comprises turning off the boost converter automatically when the battery power is less than a predetermined level.

* * * * *